United States Patent [19]

Ryabov et al.

[11] 4,035,722
[45] July 12, 1977

[54] MULTIPROBE HEAD FOR CHECKING ELECTRICAL PARAMETERS OF SEMICONDUCTOR INSTRUMENTS AND MICROCIRCUITS

[76] Inventors: Anatoly Leonidovich Ryabov, Schelkovskoe shosse, 12, korpus 2, kv. 14; Viktor Egorovich Lukyanchikov, Sakhalinskaya ulitsa, 4, kv. 142; Alexei Pavlovich Khutarev, ulitsa Chernyshevskogo, 25, kv. 11, all of Moscow, U.S.S.R.

[21] Appl. No.: 559,363

[22] Filed: Mar. 17, 1975

[51] Int. Cl.² .................. G01R 1/06; G01R 31/02
[52] U.S. Cl. ........................ 324/158 P; 324/72.5
[58] Field of Search ............ 324/158 P, 158 F, 72.5

[56] References Cited

U.S. PATENT DOCUMENTS 3,731,191   5/1973   Bullard et al. ................ 324/158 P

OTHER PUBLICATIONS

"Probe Pressure and Tip Radius," Solid State Technology, June 1969, pp. 6, 69, 70.
Beauregard et al., "High-Speed Multiprobe," IBM Tech. Dis. Bull., vol. 8, No. 8, Jan. 1966, p. 1144.

*Primary Examiner*—Rudolph V. Rolinec
*Assistant Examiner*—Ernest F. Karlsen

[57] ABSTRACT

The proposed multiprobe head comprises a probe holder which is a monolithic glass block having longitudinal capillary channels, said member being secured in a casing with its butt end facing contact elements of a semiconductor instrument or microcircuit being checked. Said capillary channels receive probes which are adapted for axial movement.

5 Claims, 6 Drawing Figures

MULTIPROBE HEAD FOR CHECKING ELECTRICAL PARAMETERS OF SEMICONDUCTOR INSTRUMENTS AND MICROCIRCUITS

The present invention relates to measuring instruments and, more specifically, to a multiprobe head for measuring electrical parameters of semiconductor instruments and microcircuits with contact elements constructed in the form of contact surfaces or contact projections (ball-type leads).

There have been two basic trends in designing multiprobe heads. One trend is to provide multiprobe heads, wherein the probes are provided with individual orientation systems and arranged at an acute angle to the contact element of semiconductor instruments and microcircuits being checked.

A multiprobe head of this type comprises a casing, whereupon there are mounted radially arranged probe holders. Each probe holder is constructed as a manipulator comprising probe shifting means for adjusting the probe in the horizontal and vertical planes. The probes are secured in the probe holder so that they are inclined with respect to contact elements.

The foregoing multiprobe head includes a great number of precision parts, which applies, in particular, to the probe adjusting manipulators. As a result, such a head is too expensive. In the course of checking there is the danger of damaging contact surfaces of microcircuits and semiconductor instruments because the probes are arranged at an acute angle to said contact surfaces. In the course of checking electrical parameters of microcircuits and semiconductor instruments with contact projections there may take place a drift of probe ends. In addition, parameter checking with the aid of this type of head requires individual adjustment of each probe.

The other basic trend in designing multiprobe heads is to provide multiprobe heads with rigidly secured probes.

There is known a multiprobe head of the latter type for checking electrical parameters of semiconductor instruments and microcircuits, which comprises a casing housing a probe holder with probes provided with leads. In the course of checking electrical parameters of semiconductor instruments and microcircuits the probes come into contact with contact elements of said semiconductor instruments and microcircuits.

This multiprobe head is constructed as a ring, whereupon there are rigidly mounted probes. The probes are arranged radially. Each probe is oriented only once in the course of manufacture, which means that a head of this type is only intended for a specific type of semiconductor instrument or microcircuit.

Each probe in this head is arranged at an acute angle to the plane of a microcircuit or semiconductor instrument being checked, whereas its contact with the contact elements is brought about by the deformation of the probes in the course of vertical movement of the multiprobe head, which means that each probe operates as a cantilever.

The probe leads in this type of head are constructed in the form of current-conducting strips on a printed circuit board which is a casing whereupon the probe holder is mounted.

The multiprobe head under review is too expensive due to the complexity of orienting probes in the course of its assembly. As the above-mentioned head, this type of head does not rule out either the danger of damaging contact surfaces of semiconductor instruments or microcircuits being checked because of the inclined positioning and cantilever-type attachment of the probes, as well as due to the possibility of a drift of the probe ends in the case of checking semiconductor instruments and microcircuits having contact projections. The latter factor makes this head unfit for checking semiconductor instruments and microcircuits with projection-type contacts.

It is an object of the present invention to provide a cheap multiprobe head for checking electrical parameters of semiconductor instruments and microcircuits.

It is another object of the present invention to ensure the stability of the transient resistance of contacts from measurement to measurement in the course of checking semiconductor instruments and microcircuits having contact projections.

It is still another object of the present invention to rule out probe end drifts.

It is yet another object of the present invention to raise the reliability of contacts in the process of checking electrical parameters of semiconductor instruments and microcircuits.

The foregoing and other objects of the invention are attained by providing a multiprobe head for checking electrical parameters of semiconductor instruments and microcircuits, comprising a casing housing a probe holder with probes which have leads and come into contact, in the course of checking electrical parameters of semiconductor instruments and microcircuits, with their contact elements, wherein the probe holder is, in accordance with the invention, a monolithic glass block having longitudinal capillary channels, the distances between said channels corresponding to these between the contact elements of a semiconductor instrument or microcircuit being checked, said probe holder being secured in said casing so that its butt end faces said contact elements, said probes being disposed in said capillary channels and adapted for axial movement.

It is expedient that the capillary channels have a triangular cross-section.

It is advisable that each probe be provided with a loop arranged inside the housing, above the other end face of the probe holder, and intended to develop a force for keeping the probe in contact with a contact element. It is also expedient to make on the end face of the casing, whereat the probe loops are located, radial slots whose numbers must be equal to that of the probes, said slots being intended to receive the leads of said probes.

It is desirable that the multiprobe head of the present invention be provided with a bushing arranged inside the casing, above the other end face of the probe holder, said bushing having a plurality of radial slots, the number of said slots corresponding to that of the probes, each slot receiving the loop of a respective probe.

The proposed multiprobe head for checking electrical parameters of semiconductor materials and microcircuits guarantees no less than $10^6$ contacts and ensures transient resistance stability when coming into contact with contact elements of any shape.

Other objects and advantages of the present invention will become more apparent from the following detailed description of a preferred embodiment there of taken in conjunction with the accompanying drawings, wherein.

Figure 1:
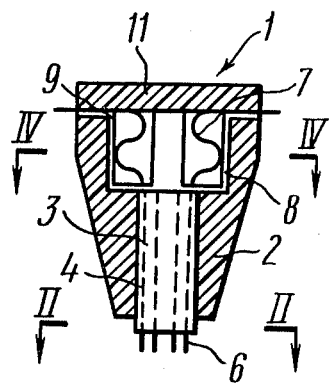
FIG. 1 is a longitudinally cut view of a multiprobe head for checking electrical parameters of semiconductor instruments and microcircuits in accordance with the invention.

Referring now to the attached drawings, the proposed multiprobe head 1 (FIG. 1) for checking electrical parameters of semiconductor instruments and microcircuits comprises a casing 2 made from a dielectric material, said casing 2 housing a probe holder 3. The latter is a monolithic glass block. The probe holder 3 has longitudinal capillary channels 4 (FIG. 2), the distances between said channels corresponding to those between contact elements 5 (FIG. 3) of a semiconductor instrument or microcircuit being checked, which distance in the case under review is the distance between contact surfaces of a microcircuit. The probe holder 3 (FIG. 1) is secured in the casing 2 so that its butt end faces said contact elements 5 (FIG. 3).

Figure 2:
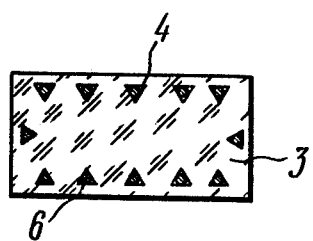
FIG. 2 is a section taken along the line II—II of FIG. 1.
Figure 3:
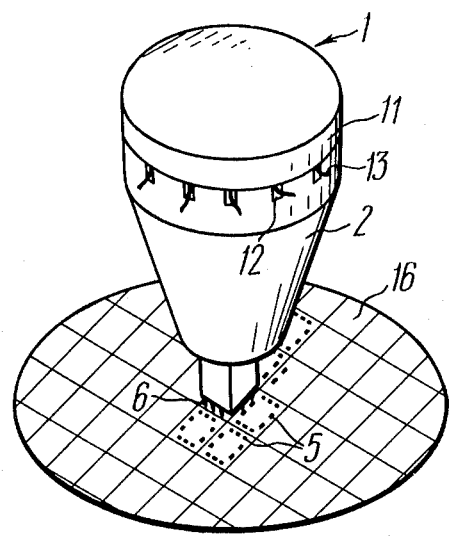
FIG. 3 is a general view of the proposed multiprobe head with a plate carrying microcircuits being checked.

Disposed inside the channels 4 (FIG. 2) are probes 6 which are adapted for axial movement, each of said probes 6 having a loop 7 (FIG. 1) arranged in a cavity 8 of the casing 2, above the end face of the probe holder 3, said loop being intended to develop a force for keeping the probe 6 in contact with the contact element 5 (FIG. 3). For better centering of the probes 6 with respect to the axes of the capillary channels 4 (FIG. 2) and to the friction of said probes 6 against the walls of the channels 4, the latter have a triangular cross-section.

Said cavity 8 (FIG. 1) houses a bushing 9 made from a dielectric material, said bushing 9 having radial slots 10 (FIG. 4) whose number coincides with that of the probes 6. Each slot 10 receives the loop 7 of the respective probe 6 (FIG. 1). The bushing 9 has a shoulder 11 which abuts against the end face of the casing 2.

Figure 5:
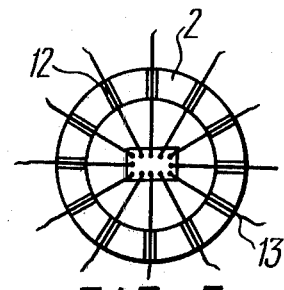
FIG. 5 is a view of the upper end face of the proposed multiprobe head (with the bushing removed)

In order to ensure reliable insulation of the probes 6 from one another, the end face of the casing 2, against which there abuts the shoulder 11 of the bushing 9, has radial slots 12 (FIG. 5) to receive leads 13 of the probes 6 (FIG. 1).

A device for checking electrical parameters of semiconductor instruments and microcircuits, wherein the function of a contacting element is performed by the multiprobe head 1 of the present invention, comprises a housing 14 (FIG. 6), whereupon there is mounted an adjustable table 15 with a plate 16 carrying microcircuits being checked. Also mounted on the housing 14 are a microscope 17 and an articulated arm 18 for introducing a semitransparent mirror 19 between the microscope 17 and the plate 16. Said mirror 19 is intended for matching the probes 6 (FIG. 3) with the contact elements 5 of a microcircuit being checked.

As regards the multiprobe head 1, it is mounted on an are 20 (FIG. 6), under the microscope 17, and is connested by means of a cable 21 to measuring units (not shown).

Figure 6:
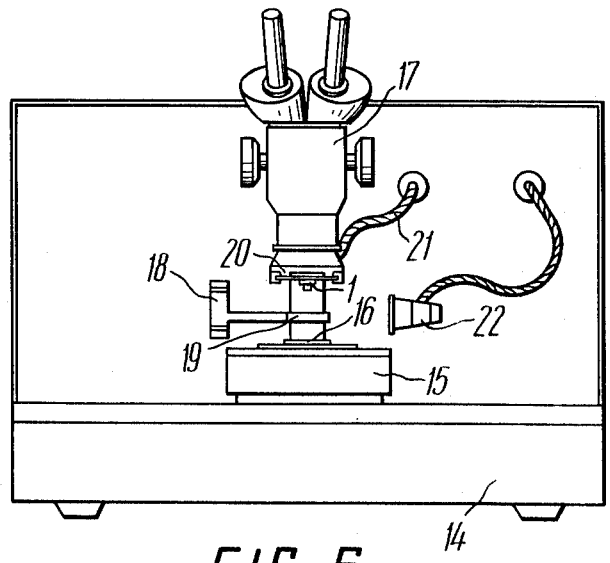
FIG. 6 is a view of a device for measuring electrical parameters of semiconductor instruments and microcircuits, employing the multiprobe head of the present invention.

In order to facilitate the matching of the probes 6 (FIG. 3) with the contact elements 5, provision is made for a light source 22 (FIG. 6.).

The proposed multiprobe head installed in the foregoing device for checking electrical parameters of semiconductor instruments and microcircuits operates as follows.

The plate 16 carrying microcircuits to be checked is placed on the adjustable table 15, and the light source 22 is switched on. The semitransparent mirror 19 is then inserted with the aid of the arm 18 between the plate 16 and the multiprobe head 1. Said mirror 19 serves to match the probes 6 (FIG. 3) of the multiprobe head 1 with the contact elements 5 of the microcircuits to be checked, which operation is performed by adjusting the table 15 (FIG. 6). After the matching the mirror 19 is removed from its position between the plate 16 and the multiprobe head 1, and the latter is moved to its lower position.

After the multiprobe head 1 has been moved to the lower position the table 15 moves upwards so that the plate 16 with the microcircuits being checked comes into contact with the probes 6 (FIG. 3). In this way electrical parameters are measured, and the results of the measurements serves to asses the adequacy of the microcircuits.

Figure 4:
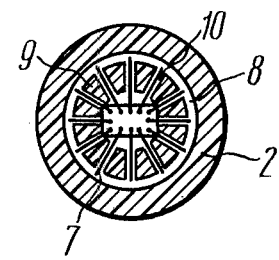
FIG. 4 is a section taken along the line IV—IV of FIG. 1.

During the time of contact between the probes 6 and the contact elements 5 of the microcircuit being checked the probes 6 are displaced in the capillary channels 4 (FIG. 2) of the probe holder 3 and deform the loops 7 (FIG. 4). As a result, the loops 7 are displaced in the radial slots 10 of the bushing 9, which radial slots 10 are insulated from one another. The deformation of the loops 7 develops a required contact force.

Upon measuring the electrical parameters of the microcircuit being checked, the adjustable table 15 (FIG. 6) is moved to its lower position and draws the plate 16 out of contact with the probes 6 (FIG. 3). The table 15 (FIG. 6) then moves the plate 16 at a pitch corresponding to that of events is repeated.

The proposed multiprobe head for checking electrical parameters of semiconductor instruments and microcircuits is 10 to 15 times cheaper than any of the conventional multiprobe heads. In contrast to the latter, its sphere of application is much broader due to its being able to ensure reliable contact with contact elements of any shape, as well as stable transient resistance from measurement to measurement. The multiprobe head of the present invention is simple in design and convenient in operation.

What is claimed is:

1. A multiprobe head for checking electrical parameters of semiconductor instruments and microcircuits having contact elements, comprising: a casing; a probe holder constructed as a monolithic glass block secured in said casing with its butt end facing the contact elements; a group of longitudinal capillary channels in said probe holder, the distances therebetween corresponding to the distances between said contact elements; a group of probes disposed in said capillary channels and adapted for axial movement, said probes coming into contact with said contact elements in the course of checking electrical parameters of semiconductor instruments and microcircuits; a lead connected to each probe; an end face of said probe holder directed towards the inside of said casing; each lead having a loop arranged above said end face of said probe holder for developing a force for keeping said probe in contact with said contact element, said capillary channels having a length sufficient for providing guidance to said probes.

2. A head as claimed in claim 1 wherein the casing has an end face having radially arranged slots for receiving said leads.

3. A head as claimed in claim 1, including a bushing inside said casing and above said end face of the probe holder, said bushing having radially arranged slots for receiving a loop associated with a respective probe.

4. A multiprobe head for checking electrical parameters of semiconductor instruments and microcircuits having contact elements, comprising: a casing; a probe holder constructed as a monolithic glass block secured in said casing with its butt end facing the contact elements; a group of longitudinal capillary channels in said probe holder, the distances terebetween corresponding to the distances between said contact elements; a group of probes disposed in said capillary channels and adapted for axial movement, said probes coming into contact with said contact elements in the course of checking electrical parameters of semiconductor instruments and microcircuits; a lead connected to each probe, said capillary channels having a triangular cross-section.

5. A multiprobe head for checking electrical parameters of semiconductor instruments and microcircuits having contact elements, comprising: a casing; a probe holder constructed as a monolithic block secured in said casing with it butt end facing the contact elements; a group of longitudinal capillary channels in said probe holder, the distances therebetween corresponding to the distances between said contact elements; a group of probes disposed in said capillary channels and adapted for axial movement, said probes coming into contact with said contact elements in the course of checking electrical parameters of semiconductor instruments and microcircuits; a lead connected to each probe; an end face of said probe holder directed towards the inside of said casing; each lead having a loop arranged above said end face of said probe holder for developing a force for keeping said probe in contact with said contact element, said capillary channels having a triangular cross-section; said casing having an end face having radially arranged slots for receiving said leads; a bushing inside said casing and above said end face of the probe holder, said bushing having radially arranged slots for receiving said loops.

* * * * *